United States Patent
Messick et al.

(10) Patent No.: US 6,451,510 B1
(45) Date of Patent: Sep. 17, 2002

(54) DEVELOPER/RINSE FORMULATION TO PREVENT IMAGE COLLAPSE IN RESIST

(75) Inventors: Scott A. Messick, Pleasant Valley, NY (US); Wayne M. Moreau, Wappingers Falls, NY (US); Christopher F. Robinson, Hyde Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/790,160

(22) Filed: Feb. 21, 2001

(51) Int. Cl.$^7$ ............... G03F 7/32; G03C 7/40
(52) U.S. Cl. ............ 430/311; 430/325; 430/326; 430/330; 430/331
(58) Field of Search .................. 430/331, 325, 430/326, 330, 311

(56) References Cited

U.S. PATENT DOCUMENTS

| | | | |
|---|---|---|---|
| 4,784,937 A | 11/1988 | Tanaka et al. | 430/331 |
| 5,474,877 A | 12/1995 | Suzuki | 430/325 |
| 5,609,983 A | 3/1997 | Kawamura et al. | 430/193 |
| 5,814,588 A | 9/1998 | Cala et al. | 510/175 |
| 5,980,643 A | 11/1999 | Jolley | 134/2 |
| 6,043,003 A | 3/2000 | Bucchignano et al. | 430/326 |
| 6,083,658 A | 7/2000 | Kunita et al. | 430/270.1 |
| 6,083,670 A | 7/2000 | Sugawara et al. | 430/399 |
| 6,159,662 A | 12/2000 | Chen et al. | 430/313 |
| 6,284,440 B1 * | 4/2001 | Hirano et al. | 430/331 |
| 6,329,126 B1 * | 12/2001 | Tanaka et al. | 430/331 |

OTHER PUBLICATIONS

Supercritical resist dryer, Hideo Namatsu, Kenji Yamazaki, and Kenji Kurihara, *J. Vac. Sci. Technol*, B 18(2), Mar./Apr. 2000, pp. 780–784.

The 3M Fluorad fluorosurfactants advantage: Dramatically reduced surface tension at extremely low concentrations, 3M Chemicals, Jul. 1998.

Mechanism of Resist Pattern Collapse during Development Process, Toshihiko Tanaka, Mitsuaki Morigami and Nobufumi Atoda, *Japan J. Appl. Phys.*, vol. 32 (1993), pp. 6059–6064, Part 1, No. 12B, Dec. 1993.

Pattern collapse in the top surface imaging process after dry development, Shigeyasu Mori, Taku Morisawa, Nobuyuki Matsuzawa, Yuko Kaimoto, Masayuki Endo, Takahiro Matsuo, Koichi Kuhara and Masaru Sasago, *J. Vac. Sci. Techol*, B 16(6), Nov./Dec. 1998, pp. 3744–3747.

* cited by examiner

*Primary Examiner*—Richard L. Schilling
(74) *Attorney, Agent, or Firm*—Delio & Peterson, LLC; James J. Cioffi

(57) ABSTRACT

An apparatus and method are provided for developing photoresist patterns on electronic component substrates such as semiconductor wafers. The method and apparatus use a specially defined developer composition in sequence with a specially defined rinse composition to develop an exposed photoresist pattern and then to rinse the developed pattern. Both the developer composition and rinse composition contain an anionic surfactant and, when the solutions are used in sequence, have been found to provide a resist pattern which avoids pattern collapse even when small features such as line widths less than 150 nm with aspect ratios of greater than about 3 are formed. It is preferred to use a puddle developing and puddle rinsing process to develop and rinse the exposed wafer. Preferred anionic surfactants are ammonium perfluoroalkyl sulfonate and ammonium perfluoroalkyl carboxylate.

5 Claims, No Drawings

DEVELOPER/RINSE FORMULATION TO PREVENT IMAGE COLLAPSE IN RESIST

BACKGROUND OF THE INVENTION

1. Field of the Invention

This invention relates generally to the fabrication of electronic components such as integrated circuit semiconductors and, in particular, to a method for avoiding resist pattern collapse in the microlithography steps of integrated circuit fabrication wherein a resist pattern is formed on the wafer surface for subsequent etch removal or material addition steps.

2. Description of Related Art

The fabrication of electrical circuits on electronic component substrates such as thin film integrated circuits and semiconductor devices such as wafers requires circuit pattern definition using a microlithographic process. Lithographic processes define substrate regions for subsequent etching removal or material addition and the trend for integration is to continue decreasing feature size which includes the line width of the electrical circuit.

Photolithography is the production of a three-dimensional relief image based on the patterned exposure to light and subsequent development of a light-sensitive photoresist on the wafer surface. Microlithography is used to print ultra small patterns in the semiconductor industry but the basic steps to form a resist image is essentially the same as in conventional optical lithography.

Broadly stated, a radiation-sensitive photoresist is applied to a substrate such as a wafer and then an image exposure is transmitted to the photoresist, usually through a mask. Depending on the type of photoresist used, exposure will either increase or decrease the solubility of the exposed areas with a suitable solvent called a developer. A positive photoresist material will become more soluble in exposed regions whereas a negative photoresist will become less soluble in exposed regions. After exposure, regions of the substrate are dissolved by the developer and no longer covered by the patterned photoresist film and the circuit pattern may now be formed either by etching or by depositing a material in the open patterned areas.

Basic steps involved in photoresist processing for microlithography comprise first cleaning the substrate and priming the substrate for adhesion of the photoresist. The wafer substrate is then coated with a photoresist typically by spin coating the resist over the wafer surface. The spin coating procedure typically has three stages wherein the photoresist is dispensed onto the wafer surface, the wafer is accelerated to a final rotational speed and then the wafer is spun at a constant speed to spread and dry the resist film. After the spinning stage, the coating acquires a relatively uniform symmetrical flow profile typically about 0.1 to 10 micrometers thick. Spin coating is typically performed at a speed from 3,000 to 7,000 rpm for twenty to sixty seconds producing coatings with uniformities to ±100 Å over a wafer with a 150 mm diameter. After spin coating, the wafers are typically soft baked to remove solvents from the resist.

The photoresist is then exposed to form the desired pattern in the resist. A post-exposure bake is then typically used and then the resist developed with a developer to remove unwanted parts of the resist and forming the desired resist pattern. The development may be done by immersing the wafer into the developer or spraying a developer solution onto the resist surface. A puddle technique may also be used in which the developer solution is puddled or dripped onto the surface of the wafer and then the wafer is spun (similarly to apply the resist material) to simultaneously spread the developer over the wafer surface. The above development techniques are described in U.S. Pat. No. 6,159,662 to Chen et al., which patent is hereby incorporated by reference.

To stop the development process, the developer then is rinsed from the substrate surface with a rinse solution and this is also typically performed by immersion, spraying or puddling as described above.

A post-development baking step is typically performed to remove residual solvents, improve adhesion and increase the etch resistance of the resist. The wafer can then be treated by etching or the addition of materials depending on the results desired.

Unfortunately, as the demands of industry require smaller feature sizes, the line width defined by the resist is likewise smaller. However, the resist pattern height cannot be significantly reduced because the pattern must have a certain height or thickness in order to remain functional. The ratio of the height of the resist to the width of the standing line defined by the resist is called the aspect ratio and when lined patterns with a high aspect ratio are formed, a serious problem occurs since the resist pattern has a tendency to fall down or collapse.

An article by Tanaka et al. in Japan J. Appl. Phys. vol. 32 (1993) pps. 6059–6064 entitled "Mechanism of Resist Pattern Collapse During Development Process" discusses the problem of fine resist pattern collapse. In one form of collapse, the tips of the pattern come in contact with each other and the pattern collapse results in a bending, breaking, tearing or peeling of the resist pattern which results in the patterned wafer being unsuitable for further processing.

Image collapse is a serious problem especially as the features on the wafer become smaller, for example, for aspect ratios greater than about 3 and lines less than 150 nm in width. As a person skilled in the art would appreciate, as the aspect ratio is increased and the line width decreases, the problem becomes more pronounced and in lines having an aspect ratio of 6 and 100 nm line width the collapse problem is very severe.

Industry has tried a number of solutions to solve the collapse problem. In the Tanaka article, supra, it was concluded that the source of resist pattern collapse was the surface tension of the rinse liquid and a low-surface-tension rinse liquid was proposed such as a mixture of tert-butylalcohol and water in a mixture ratio of 50:50 volume percent. Use of a supercritical resist dryer to prevent pattern collapse is proposed in an article by Namatsu et al. entitled "Supercritical Resist Dryer" reported in the J. Vac. Sci. Technol. B 18(2), March/April 2000. U.S. Pat. No. 4,784,937 to Tanaka et al. shows the use of an aqueous developing solution for a positive-working photoresist composition containing an organic base such as tetramethyl ammonium hydroxide and an anionic or non-ionic fluorine-containing surface active agent to improve the dissolving selectivity between the exposed areas and unexposed areas of the photoresist layer. U.S. Pat. No. 5,474,877 to Suzuki shows a method for developing a photoresist pattern using a rinsing liquid close to its boiling point to decrease the surface tension of the rinsing liquid so that the collapse of the photoresist pattern is avoided. The above articles and patents are hereby incorporated by reference.

Bearing in mind the problems and deficiencies of the prior art, it is therefore an object of the present invention to provide a method for developing a photoresist pattern on an electronic component substrate such as a semiconductor wafer to avoid pattern collapse of the developed photoresist.

In another object of the present invention an apparatus is provided for developing photoresist patterns on electronic component substrates such as semiconductor wafers to avoid pattern collapse of the developed photoresist.

It is further object of the invention to provide electronic component substrates including semiconductor wafers which have been developed using the method and apparatus of the invention.

It is yet another object of the present invention to provide electronic components such as semiconductor wafers made using electronic component substrates developed using the method and apparatus of the invention.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method for developing a photoresist pattern on an electronic component substrate such as a semiconductor wafer for avoiding collapse of the developed pattern comprising the steps of:

coating a photoresist film on an electronic component substrate;

exposing the photoresist film to a predetermined pattern;

supplying a developer composition to the exposed photoresist film to develop the photoresist pattern, the developer composition containing an anionic surfactant in a sufficient amount to avoid collapse of the pattern;

developing the photoresist film to form the predetermined photoresist pattern and maintaining the substrate wet;

supplying a rinse water solution on the wet developed substrate, the rinse water solution comprising deionized water and an anionic surfactant in an amount sufficient to avoid collapse of the pattern;

rinsing the developed substrate; and drying the developed substrate to form an electronic component substrate having a predetermined photoresist pattern thereon.

In another aspect of the present invention, an apparatus is provided for developing a photoresist pattern on an electronic component substrate such as a semiconductor wafer for avoiding collapse of the developed pattern comprising:

coating means for coating a photoresist film on an electronic component substrate;

exposing means for exposing the photoresist film to a predetermined pattern;

supplying means for supplying a developer composition on the exposed photoresist film, the developer composition containing an anionic surfactant in a sufficient amount to avoid collapse of the pattern;

developing means for developing the photoresist film to form the predetermined photoresist pattern and maintaining the substrate wet;

supplying means for supplying a rinse composition on the wet developed substrate, the rinse composition comprising water and an anionic surfactant in an amount sufficient to avoid collapse of the pattern;

rinsing means for rinsing the developed electronic component substrate; and drying means for drying the developed substrate to form an electronic component substrate having a predetermined photoresist pattern thereon.

In another aspect of the present invention, the method and apparatus of the invention is employed to develop a photoresist on electronic component substrates to avoid pattern collapse of the developed substrate.

DESCRIPTION OF THE PREFERRED EMBODIMENT

The present invention is applicable to developing photoresist patterns on a variety of electronic component substrates such as printed circuit boards, integrated circuits, microelectromechanical devices and magnetic discs components and is particularly applicable to developing photoresist patterns on semiconductor wafers having small feature sizes characterized by line widths less than 150 nm and high aspect ratios greater than about 3. For convenience, the following description will be directed to the use of a positive photoresist on a semiconductor wafer and it will be appreciated by those skilled in the art that other type photoresists and other type electronic component substrates may be used in the method and apparatus of the invention. A negative type resist can also be used.

The present invention may be broadly stated as comprising a method and apparatus for developing photoresist patterns on semiconductor wafers wherein both the developer composition and the rinse composition are used sequentially and both contain an anionic surfactant. The use of an anionic surfactant in both the developer composition and rinse composition has been found to minimize and/or avoid the problem of pattern collapse in the developed wafer substrate.

Any photoresist may be used in the method and apparatus of the invention and as noted above the following description is directed to a positive photoresist such as KRS (Ketal resist system) as described in U.S. Pat. No. 6,043,003. Likewise, any method for exposing the photoresist film to a predetermined pattern may be used such as ultraviolet, electron beam, x-rays and ion beams.

After the photoresist film has been formed on a semiconductor wafer surface it is preferred to soft-bake the film to remove solvents and this is typically done at a temperature of about 90° C. to 150° C. for 30 to 120 seconds on a hot plate. Any suitable time and temperature and baking equipment may be used however depending on the photoresist used.

The photoresist is then exposed and this may be performed using any of the standard and conventional techniques in the art such as projection or direct write. It is preferred after the exposure to bake the exposed photoresist film for about 1 to 2 minutes at 70 to 150° C. to amplify the latent image.

There are essentially four methods that are used to develop a photoresist image on a semiconductor wafer and these include quiescence, immersion, spray and puddle development. In each method, the development time and temperature must be carefully controlled as will be appreciated by those skilled in the art. U.S. Pat. No. 6,159,662, supra, discusses the development process.

The quiescense method adds developer to the exposed wafer surface, and, after a period of time sufficient to develop the pattern, a rinse composition is added to the wafer surface. After rinsing the wafer is dried.

The immersion process basically comprises dipping the exposed semiconductor wafer into a bath of the developer composition for a certain period of time and then removing the wafer from the bath. After the wafer has been removed from the immersion bath, it is immersed in a rinse composition bath. A displacement rinse method may be used using the same tank for both the development immersion and rinsing. Instead of immersing the developed wafer, the immersed wafer could be rinsed by spraying.

In the spray development method, the exposed wafer is sprayed with the developer composition for a certain period of time to develop the pattern typically for about 1–2 minutes. The developed wafer would then be sprayed with the rinse composition to rinse the developer from the wafer surface. The rinse composition would typically be sprayed for about 1–2 minutes and then dried using conventional techniques such as air drying.

In a preferred embodiment, because of its demonstrated effectiveness, a puddle development process is used in which the developer composition is puddled onto the exposed semiconductor wafer while the wafer is at rest and then the wafer spun slowly at, for example, 100 rpm to distribute the developer composition over the wafer surface. Then developer is left on the wafer surface for sufficient developing time to develop the pattern, e.g., 1–2 minutes. The rinse composition is then puddled onto the still wet wafer surface typically while the wafer is at rest and spun similarly to the developer composition to rinse the wafer. After the rinsing procedure, the rinsed wafer is dried, typically by spin drying.

With regard to the developer composition, any suitable commercial developer composition may be used in the invention with the proviso that the developer composition contain an anionic surfactant as defined hereinbelow. Developer compositions are typically basic and may contain potassium hydroxide, sodium hydroxide, sodium silicate and the like as the principal component but it is highly preferred that the basic component be a basic organic compound which is free from metal ions such as tetramethyl ammonium hydroxide.

As described in U.S. Pat. No. 4,784,937, supra, the basic organic compound free from metal ions is the principal ingredient of the developer composition used in the inventive method and may be any of known compounds conventionally used in the developing solution of this type. Exemplary of such basic organic compounds are aliphatic and aromatic amine compounds such as alkylene diamines, e.g., 1,3-diaminopropane, and aryl amines, e.g., 4,4'-diaminodiphenyl amine, as well as bis(dialkylamino) imines, heterocyclic bases having a ring structure formed of 3 to 5 carbon atoms and 1 or 2 hetero atoms selected from nitrogen, oxygen and sulfur atoms as the ring members, e.g., pyrrole, pyrrolidine, pyrrolidone, pyridine, morpholine, pyrazine, piperidine, oxazole and thiazole, lower alkyl quaternary ammonium bases and others.

Particularly preferable among the above are the tetraalkyl ammonium hydroxides where the alkyl group is C1–C4 or a substituted C1–C4. Exemplary are tetramethyl ammonium hydroxide (TMAH) and trimethyl 2-hydroxyethyl ammonium hydroxide, i.e., choline. Other ammonium hydroxides include tetraethylammonium hydroxide, tetrapropylammonium hydroxide, tetrabutylammonium hydroxide, methyltriethylammonium hydroxide, trimethylethylammonium hydroxide, dimethyldiethylammonium hydroxide, triethyl (2-hydroxyethyl)ammonium hydroxide, dimethyldi(2-hydroxyethyl)ammonium hydroxide, diethyldi(2-hydroxyethyl)ammonium hydroxide, methyltri(2-hydroxyethyl)ammonium hydroxide, ethyltri(2-hydroxyethyl)ammonium hydroxide, and tetra(2-hydroxyethyl)ammonium hydroxide. The above named organic bases free from metal ions can be used singly or as a combination of two kinds or more accordingly to need.

The inventive developing solution is typically prepared in the pH range of about 11.0 to 13.5 by dissolving the above mentioned base compound in deionized water.

The optional additives used in conventional developer compositions may also be used in the developer compositions of the invention and include stabilizers and dissolving aids, and monohydric alcohols, which serve to remove residues of the photoresist which may otherwise be left on the exposed areas after development. These optional additives can be added to the inventive developing solution either singly or as a combination of two kinds or more according to need.

It is an important feature of the invention that an anionic surfactant be used in both the developer composition and rinse water composition of the present invention.

Anionic surfactants are characterized by having a large non-polar hydrocarbon end that is oil soluble and a polar end that is water-soluble. For sodium lauryl sulfate, for example, the $C_{11}H_{22}CH_2$ group is the non-polar end and the $OSO_3^-$ $Na^+$ is the polar end.

The anionic class of detergents includes ordinary alkali metal soaps such as the sodium, potassium, ammonium and alkyl ammonium salts of higher fatty acids containing from about 8 to about 24 carbon atoms and preferably from about 10 to about 20 carbon atoms.

This class of detergents also includes water-soluble salts, particularly non-metal ammonium salts of organic sulfuric reaction products having in their molecular structure an alkyl radical containing from about 8 to about 22 carbon atoms and a sulfonic acid or sulfuric acid or sulfuric acid ester radical. (Included in the term alkyl is the alkyl portion of higher acyl radicals.) Examples of this group of synthetic detergents which form a part of the preferred detergent compositions of the present invention are the ammonium alkyl sulfates, especially those obtained by sulfating the higher alcohols ($C_8$-$C_{19}$ carbon atoms); ammonium alkyl benzene sulfonates, in which the alkyl group contains from about 9 to about 15 carbon atoms, in straight chain or branched chain configuration.

Anionic phosphate surfactants are also useful in the present invention. These are surface active materials in which the anionic solubilizing group connecting hydrophobic moieties is an oxy acid of phosphorus. The more common solubilizing groups are —$SO_4H$, —$SO_3H$, and —$CO_2H$. Alkyl phosphates esters such as $(R—O)_2PO_2H$ and $ROPO_3H_2$ in which R represents an alkyl chain containing from about 8 to about 30 carbon atoms are useful.

A preferred anionic surfactant is a fluorine-containing surface active agent represented by the general formula

or

in which $R_f$ and $R'_f$ each denote a monovalent hydrocarbon group having from 2 to 20 carbon atoms, of which at least a part of the hydrogen atoms are replaced with fluorine atoms, and M denotes a hydrogen atom H, ammonium $NH_4$ or quaternary ammonium $NR_4$, each R being, independently from the others, a hydrogen atom or a alkyl group having from 1 to 3 carbon atoms. More particularly, the fluorine-containing carboxylic and sulfonic acids and salts of the above mentioned types having an activity as a surface active agent include straight-chain or branched-chain perfluorocarboxylic acids of the formula $C_nF_{2n+1}COOH$, perfluoroalkane sulfonic acids of the formula $C_nF_{2n+1}SO_3H$, partially fluorinated carboxylic acids of the formula $C_nF_{2n+1}C_mH_{2m}COOH$, partially fluorinated unsaturated carboxylic acids of the formula $C_nF_{2n+1}C=CHC_mH_{2m}COOH$, partially fluorinated alkane sulfonic acids of the formula $C_nF_{2n+1}C_mH_{2m}SO_3H$ and partially fluorinated alkene sulfonic acids of the formula $C_nF_{2n+1}CH=CHC_mH_{2m}SO_3H$, in which n and m are each a positive integer of 1 to 10 and 1 to 15, respectively, as well as ammonium salts and tetraalkyl ammonium salts thereof.

Particular compounds belonging to these classes include perfluorocaprylic acid $C_7F_{15}COOH$, perfluorooctane sulfonic acid $C_8F_{17}SO_3H$, ammonium perfluorocaprate $C_9F_{19}COONH_4$, tetramethyl ammonium perfluorocaprylate $C_7F_{15}COON(CH_3)_4$, $C_5F_{11}(CH_2)_3COOH$, $CF_3(CF_2)_3CF(CF_3)(CH_2)_{10}COONH_4$, $CF_3(CF_2)_6CH=CH(CH_2)_2COOHN_4$ and the like though not limited thereto. These compounds can be used either singly or a combination of two kinds or more according to need.

The developer composition will typically contain a base in an amount of about 10 to 40 g/l to provide a pH of about 12 to 13. A 0.21 N or a 0.26 N solution are typically used. An anionic surfactant is present in the developer composition in an amount sufficient to provide the desired anti-collapse properties of the compositions used in the method and apparatus of the invention and generally is in an amount of about 100 to 10,000 ppm or more, preferably 500 to 5,000 ppm.

The developer composition may be used at a wide variety of temperatures up to 35° C. or higher, and is typically about 19 to 25° C., preferably 21° C.

The rinse composition preferably comprises deionized water and the above described anionic surfactant in an amount of about 100 to 10,000 ppm or more, preferably 500 to 5,000 ppm to provide the desired anti-collapse properties for the method and apparatus of the invention.

The rinse composition may be used at a wide variety of temperatures up to 35° C. or higher, and is typically about 19 to 25° C., preferably 21° C.

EXAMPLE

A semiconductor wafer was coated with a KRS positive resist by spin coating using a puddling procedure. The resist coated wafer was exposed to provide line and space widths of about 100 nm with an aspect ratio of about 6. The exposed wafer was developed by puddling a deionized water solution of 0.263 N TMAH and 1% by weight FC-93 (25% active) on the wafer surface while the wafer was at rest. FC-93 is an ammonium perfluoroalkyl sulfonate surfactant sold by 3M Chemicals. After developing and while the wafer was still wet, the still wet wafer was rinsed with a rinse composition containing deionized water and FC-93 anionic surfactant at a level of 1 weight %. The rinse composition was applied to the wafer at rest and the wafer was rinsed by spinning and then air dried. The results show that the resist pattern did not collapse and was satisfactory from a commercial standpoint. A control sample (no surfactant added to developer and rinse) collapsed at an aspect ratio of 3.5.

The above example was repeated using FC-143 which is an anionic surfactant comprising an ammonium perfluoroalkyl carboxylate surfactant and is also sold by 3M Chemicals. The developed resist pattern did not collapse and was commercially acceptable.

The above example was repeated using as the anionic surfactant ammonium lauryl sulfate in amount of about 0.5% by weight. In this case, an aspect ratio of 4 was achieved as the upper limit.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is: What is claimed is:

1. A method for developing a photoresist pattern on an electronic component substrate for avoiding collapse of the developed pattern comprising the steps of:

coating a photoresist film on an electronic component substrate;

exposing the photoresist film to a predetermined pattern;

supplying a developer composition to the exposed photoresist film to develop the photoresist pattern, the developer composition containing an anionic surfactant in a sufficient amount to avoid collapse of the pattern;

developing the photoresist film to form the predetermined photoresist pattern and maintaining the substrate wet;

supplying a rinse water solution on the wet developed substrate, the rinse water solution comprising deionized water and an anionic surfactant in an amount sufficient to avoid collapse of the pattern;

rinsing the developed substrate; and drying the developed substrate to form an electronic component substrate having a predetermined photoresist pattern thereon.

2. The method of claim 1 wherein the anionic surfactant is a fluorine-containing surface active agent represented by the general formula

or

in which $R_f$ and $R'_f$ each denote a monovalent hydrocarbon group having from 2 to 20 carbon atoms, of which at least a part of the hydrogen atoms are replaced with fluorine atoms, and M denotes a hydrogen atom H, ammonium $NH_4$ or quaternary ammonium $NR_4$, each R being, independently from the others, a hydrogen atom or a alkyl group having from 1 to 3 carbon atoms.

3. The method of claim 1 wherein a puddling method is used to apply the developer composition and rinse solution.

4. The method of claim 1 wherein a spray method is used to apply the developer composition and rinse solution.

5. The method of claim 1 wherein the electronic component is a semiconductor wafer.

* * * * *